(12) United States Patent
Wang et al.

(10) Patent No.: US 7,968,967 B2
(45) Date of Patent: Jun. 28, 2011

(54) ONE-TIME-PROGRAMMABLE ANTI-FUSE FORMED USING DAMASCENE PROCESS

(75) Inventors: Ming-Tsong Wang, Taipei (TW); Tong-Chern Ong, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 1010 days.

(21) Appl. No.: 11/487,849

(22) Filed: Jul. 17, 2006

(65) Prior Publication Data

US 2008/0012138 A1    Jan. 17, 2008

(51) Int. Cl.
*H01L 23/52* (2006.01)
*H01L 23/48* (2006.01)
*H01L 29/40* (2006.01)

(52) U.S. Cl. ........... 257/530; 257/529; 257/E23.147; 257/E23.149; 257/774; 257/758

(58) Field of Classification Search .......... 257/758, 257/209, 529, 530, E23.147, E23.149, E21.592, 257/774

See application file for complete search history.

(56) References Cited

U.S. PATENT DOCUMENTS

| | | | | |
|---|---|---|---|---|
| 5,451,810 A * | 9/1995 | Tigelaar et al. | ........... | 257/530 |
| 5,508,220 A * | 4/1996 | Eltoukhy et al. | ........... | 438/600 |
| 5,573,971 A * | 11/1996 | Cleeves | ........... | 438/600 |
| 5,962,911 A * | 10/1999 | Manley | ........... | 257/530 |
| 5,976,928 A * | 11/1999 | Kirlin et al. | ........... | 438/240 |
| 6,097,077 A * | 8/2000 | Gordon et al. | ........... | 257/530 |
| 6,154,410 A * | 11/2000 | Cutter et al. | ........... | 365/225.7 |
| 6,185,122 B1 | 2/2001 | Johnson et al. | | |
| 6,436,787 B1 | 8/2002 | Shih et al. | | |
| 6,465,282 B1 * | 10/2002 | Tobben et al. | ........... | 438/131 |
| 6,524,957 B2 * | 2/2003 | Merchant et al. | ........... | 438/687 |
| 6,638,794 B2 * | 10/2003 | Tseng | ........... | 438/128 |
| 6,682,970 B1 * | 1/2004 | Thakur et al. | ........... | 438/240 |
| 6,706,629 B1 * | 3/2004 | Lin et al. | ........... | 438/687 |
| 6,730,573 B1 * | 5/2004 | Ng et al. | ........... | 438/381 |
| 6,920,067 B2 | 7/2005 | Hsu et al. | | |
| 6,975,033 B2 * | 12/2005 | Ito et al. | ........... | 257/761 |
| 6,985,378 B2 * | 1/2006 | Kozicki | ........... | 365/153 |
| 7,332,401 B2 * | 2/2008 | Moore et al. | ........... | 438/381 |
| 7,615,439 B1 * | 11/2009 | Schricker et al. | ........... | 438/237 |
| 2002/0171119 A1 * | 11/2002 | Sasaki | ........... | 257/529 |
| 2003/0031074 A1 * | 2/2003 | Tran et al. | ........... | 365/225.7 |
| 2003/0064572 A1 * | 4/2003 | Johnson | ........... | 438/527 |
| 2003/0116854 A1 * | 6/2003 | Ito et al. | ........... | 257/761 |
| 2005/0023638 A1 * | 2/2005 | Bhattacharyya et al. | ........... | 257/530 |
| 2005/0029665 A1 * | 2/2005 | Lin et al. | ........... | 257/762 |
| 2005/0146034 A1 * | 7/2005 | Andreyushchenko et al. | ........... | 257/751 |
| 2005/0161710 A1 * | 7/2005 | DeBoer et al. | ........... | 257/240 |
| 2007/0040205 A1 * | 2/2007 | Blalock et al. | ........... | 257/306 |
| 2007/0069241 A1 * | 3/2007 | Yang et al. | ........... | 257/209 |

OTHER PUBLICATIONS

Ueno, K., et al., "A High Reliability Copper Dual-Damascene Interconnection with Direct-Contact Via Structure," IEDM, 2000, pp. 265-268.

* cited by examiner

*Primary Examiner* — Teresa M Arroyo
(74) *Attorney, Agent, or Firm* — Slater & Matsil, L.L.P.

(57) ABSTRACT

A semiconductor structure includes a semiconductor substrate, a power source, and a stacked structure over the semiconductor substrate and coupled to the power source. The stacked structure includes a bottom electrode, a top electrode, and an insulation layer between the top electrode and the bottom electrode, wherein the insulation layer has a breakdown voltage lower than a pre-determined write voltage provided by the power source and higher than a pre-determined read voltage provided by the power source.

7 Claims, 5 Drawing Sheets

ONE-TIME-PROGRAMMABLE ANTI-FUSE FORMED USING DAMASCENE PROCESS

TECHNICAL FIELD

This invention relates generally to semiconductor devices, and more particularly to the structure and fabrication methods of one-time-programmable anti-fuse cells.

BACKGROUND

In the field of data storage, there are two main types of storage elements. The first type is volatile memory, in which information is stored in a particular storage element and the information is lost the instant the power is removed from the circuit. The second type is a non-volatile storage element, in which the information is preserved even when the power is removed. Of the second type, some designs allow multiple programming while other designs allow only one-time programming. Typically, the manufacturing techniques used to form non-volatile memory are quite different from standard logic processes, thereby dramatically increasing the complexity and cost.

Typically, one-time-programmable (OTP) memory devices include metal fuses, gate oxide fuses, etc. Metal fuses, as the name suggests, use metal fuses as programming elements. Gate oxide fuses include gate oxides as programming elements.

Conventional OTP memory devices were typically fabricated using aluminum interconnect technologies, which involve aluminum deposition, patterning, and etching, and thus are not compatible with current copper damascene processes, which have become standard processes. In addition, conventional OTP memory devices require either high voltage (such as gate oxide fuses) or high current (such as metal and via anti-fuses) for programming. Such high voltage or high current requirements need to be taken into design considerations, and thus the complexity and the cost of fabricating integrated circuits increases accordingly.

A logic-process-compatible one-time-programmable memory device is therefore highly desirable. Particularly, to be fully compatible with existing CMOS integrated circuits, the high programming current and/or high voltage requirements need to be lowered.

SUMMARY OF THE INVENTION

In accordance with one aspect of the present invention, a semiconductor structure includes a semiconductor substrate, a power source, and a stacked structure over the semiconductor substrate and coupled to the power source. The stacked structure includes a bottom electrode, a top electrode, and an insulation layer between the top electrode and the bottom electrode, wherein the insulation layer has a breakdown field/voltage lower than a pre-determined write voltage provided by the power source and higher than a pre-determined read voltage provided by the power source.

In accordance with another aspect of the present invention, a one-time-programmable (OTP) anti-fuse includes a semiconductor substrate, a first dielectric layer over the semiconductor substrate, a lower-level metal line comprising copper in the first dielectric layer, a via over the lower-level metal line wherein the via and the lower-level metal line define an area of at least partial alignment, an insulation layer between the lower-level metal line and the via and occupying the area of at least partial alignment, and an upper-level metal line comprising copper in a second dielectric layer having a low dielectric constant, wherein the upper-level metal line is over and electrically coupled to the via.

In accordance with yet another aspect of the present invention, an OTP anti-fuse includes a semiconductor substrate, a bottom metal line in the first dielectric layer, a second dielectric layer over the bottom metal line and the first dielectric layer, an opening in the second dielectric layer, a diffusion barrier layer in the opening, the diffusion barrier layer extending onto the bottom metal line and sidewalls of the opening, an insulation layer in the opening and enclosed by the diffusion barrier layer from bottom and sides, and a top metal line filling a remaining portion of the opening. The insulation layer has a breakdown field/voltage lower than a pre-determined write voltage provided by a power source and higher than a pre-determined read voltage provided by the power source.

In accordance with yet another aspect of the present invention, a method for forming an OTP anti-fuse includes providing a semiconductor substrate, pre-determining a read voltage, pre-determining a write voltage, and forming a stacked structure over the semiconductor substrate. The step of forming the stacked structure includes forming a bottom electrode, forming a top electrode, and forming an insulation layer between the top electrode and the bottom electrode, wherein the insulation layer is configured to be broken down if the write voltage is applied between the top electrode and the bottom electrode, and to not be broken down if the read voltage is applied between the top electrode and the bottom electrode.

In accordance with yet another aspect of the present invention, a method for forming an OTP anti-fuse includes providing a semiconductor substrate, forming a first dielectric layer over the semiconductor substrate, forming a lower-level metal line comprising copper in the first dielectric layer, forming an insulation layer having at least a portion over the lower-level metal line, forming a via over the insulation layer, and forming an upper-level metal line comprising copper over the via, wherein the upper-level metal line is in a second dielectric layer.

In accordance with yet another aspect of the present invention, a method for forming an integrated circuit structure includes simultaneously forming a first lower-level copper line and a second lower-level copper line in a first dielectric layer, simultaneously forming a first diffusion barrier layer having at least a portion over the first lower-level copper line and a second diffusion barrier having at least a portion over the second lower-level copper line, forming an insulation layer over the first diffusion barrier layer, simultaneously forming a third diffusion barrier layer over the insulation layer and a fourth diffusion barrier layer over the second diffusion barrier layer, simultaneously forming a first via over the third diffusion barrier layer and a second via over the fourth diffusion barrier layer, and simultaneously forming a first upper-level copper line and a second upper-level copper line in a third dielectric layer, wherein the first upper-level copper line is electrically coupled to the third diffusion barrier layer and the first via, and wherein the second upper-level copper line is electrically coupled to the second lower-level copper line and the second via.

The advantageous features of the present invention include reduced write voltages and full compatibility with the existing formation processes of integrated circuits.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

A one-time-programmable (OTP) anti-fuse cell and the methods of forming the same are provided. The intermediate stages of manufacturing a preferred embodiment of the present invention are illustrated. The operations of the preferred embodiments are then discussed. Throughout the various views and illustrative embodiments of the present invention, like reference numbers are used to designate like elements.

Figure 1:
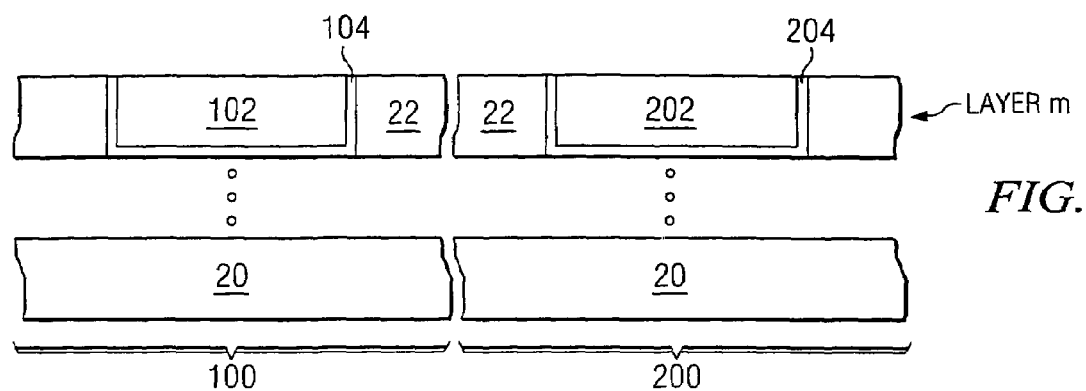
FIGS. 1 through 8 are cross-sectional views of intermediate stages in the manufacture of a first embodiment of the present invention, wherein a via-like anti-fuse is formed.

In a first embodiment, an OTP anti-fuse cell, which has a via-like structure, is formed simultaneously with a via structure. Both the OTP anti-fuse and the via structure comprise lower-level metal lines and upper-level metal lines interconnected by vias. FIG. 1 illustrates two regions 100 and 200 over a semiconductor substrate 20, which have devices (not shown) formed thereon. Region 100 is used for forming an OTP anti-fuse cell, and region 200 is used for forming a via. FIG. 1 also illustrates a metallization layer m over the semiconductor substrate 20, wherein metallization layer m includes a dielectric layer 22, a lower-level metal feature 102 in region 100 and a lower-level metal feature 202 in region 200. Metallization layer m may be any of the metallization layers except the top metallization layer. Dielectric layer 22 preferably comprises a material having a dielectric constant (k value) of less than 3.9, and may contain nitrogen, carbon, hydrogen, oxygen, fluorine, and combinations thereof. More preferably, dielectric layer 22 is a porous film with a k value of less than about 3.5. Dielectric layer 22 may be formed using commonly used methods, such as chemical vapor deposition (CVD), spin-on, atomic layer deposition (ALD), plasma enhanced CVD (PECVD), and the like. For simplicity, semiconductor substrate 20 is not shown in subsequent drawings.

In the preferred embodiment, metal lines 102 and 202 are formed using a single damascene process, in which trenches are formed first, followed by the formation of diffusion barrier layers 104 and 204 and metal lines 102 and 202 in the trenches. Diffusion barrier layers 104 and 204 are used to prevent copper in metal lines 102 and 202 from diffusing into and poisoning the neighboring dielectric materials. The preferred materials for diffusion barrier layers 104 and 204 include titanium, titanium nitride, tantalum, tantalum nitride, ruthenium, ruthenium nitride, and other alternatives. Preferably, metal lines 102 and 202 comprise copper or copper alloys, although they may comprise other metallic materials such as aluminum, silver, gold, and the like. In the preferred embodiment, the formation of metal lines 102 and 202 includes depositing a thin layer of seed copper or copper alloy, then plating to fill the trenches. In other embodiments, commonly used chemical vapor deposition (CVD) methods such as plasma enhanced CVD can be used. A chemical mechanical polish (CMP) is performed to remove excess material and level the surfaces of the metal lines 102 and 202. Cap layers (not shown) may be formed on metal lines 102 and 202 to prevent copper from being in direct contact with low-k dielectric materials.

Figure 2:
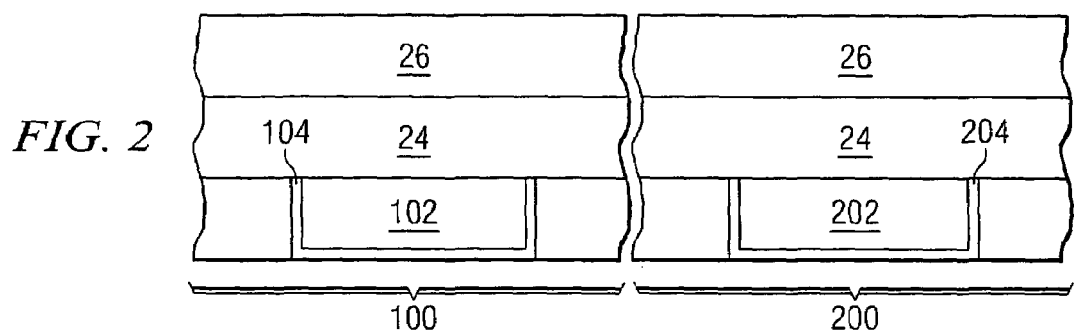

Referring to FIG. 2, a via inter-metal dielectric (IMD) layer 24 and a trench MD layer 26 are successively formed. Via IMD layer 24 preferably has a low k value of less than about 3.9 and may comprise carbon-doped silicon oxide, fluorine-doped silicon oxide, organic low-k materials, and/or porous low-k materials. It is preferably formed by spin-on, chemical vapor deposition (CVD), or other known methods. More preferably, dielectric layers 24 and/or 26 are porous films having low dielectric constants of less than about 3.5. In the preferred embodiment, the materials of dielectric layer 22 and IMD layers 24 and 26 have different etching characteristics, so that one layer may be used as an etch stop layer when the overlying layer is etched. In alternative embodiments, etch stop layers (not shown) are formed between layers 22, 24 and 26.

Figure 3:
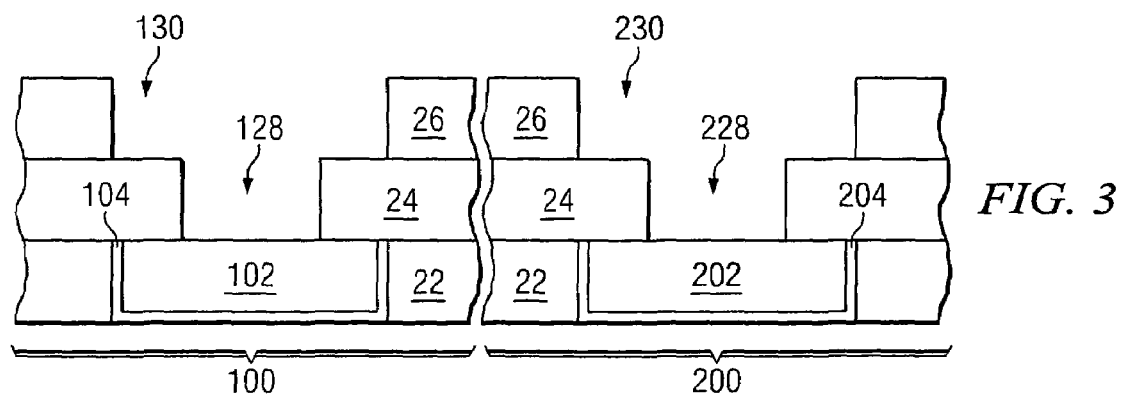

FIG. 3 illustrates the formation of via openings 128 and 228 and trench openings 130 and 230 in regions 100 and 200, respectively. To form via openings 128 and 228, a photo resist (not shown) is formed and patterned over trench IMD layer 26. An anisotropic etching cuts through trench IMD layer 26 and via IME layer 24 and stops at the metal lines 102 and 202, respectively. The photo resist is then removed. Similarly, with the masking of an additional photo resist (not shown), trench openings 130 and 230 are formed, preferably by an anisotropic etching cutting through trench IMD layer 26.

Figure 4:
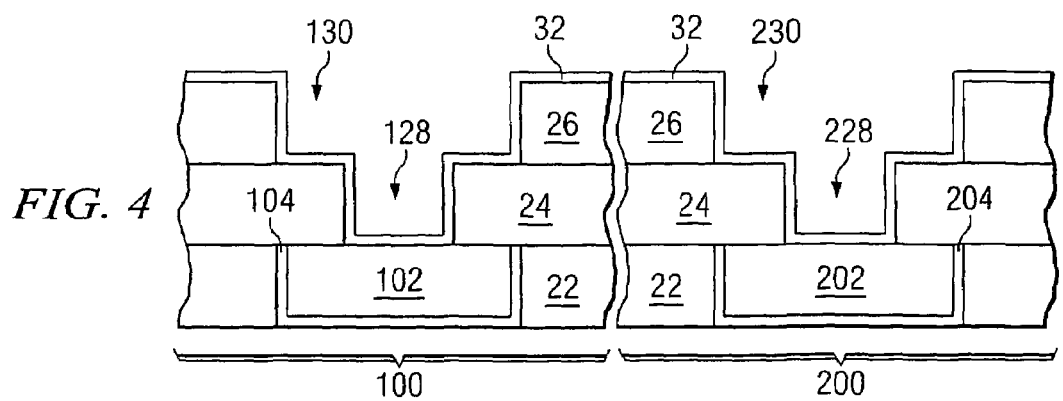

FIG. 4 illustrates the formation of a diffusion barrier layer 32, which is preferably formed of a material resistive to diffusion of copper, such as titanium, titanium nitride, tantalum, tantalum nitride, and the like, and which may have a composite structure comprising more than one layer.

Figure 5:
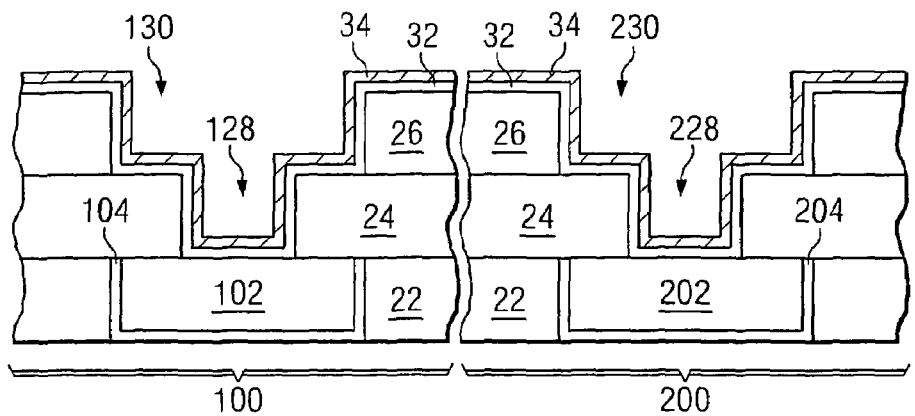

A thin insulation layer 34 is then formed, as shown in FIG. 5. Preferably, insulation layer 34 includes a material having a low breakdown field/voltage. In the preferred embodiment, insulation layer 34 includes a low-k dielectric material, although oxides, nitrides, oxynitrides, and high-k dielectric materials can also be used. More preferably, insulation layer 34 has a k value of less than about 3.9, and even more preferably less than about 3.5. The preferred materials include Black Diamond® from Applied Materials (SiOCH), Coral from Novellus, fluorinated silicate glass (FSG), hydrogen silsesquioxane (HSQ), carbon-doped silicon oxide, fluorine-doped silicon oxide, organic low-k materials, and/or porous low-k materials. In other embodiments, insulation layer 34 includes high-k materials (k value greater than about 3.9) that are easy to breakdown, such as $HfO_2$, $Ta_2O_5$, $ZrO_2$, $Pr_2O_3$, $TiO_2$, $SrTiO_3$, and the like. Preferably, the formation methods include plasma enhanced chemical vapor deposition (CVD), atomic layer deposition (ALD), spin on, and the like. In an exemplary embodiment, insulation layer 34 comprises Black Diamond and is formed using CVD. The process conditions include a reaction gas trimethylchlorsilane (TMS) at a flow rate of between about 10 sccm and about 1200 sccm, oxygen at a flow rate of between about 10 sccm and about 500 sccm, a RF power of between about 100 W and about 1000 W, a deposition temperature of between about 300° C. and about 400° C., and a deposition time of between about 0.1 seconds and about 100 seconds.

The thickness and material of the insulation layer 34 partially determine the breakdown field/voltage, hence the write voltage of the OTP anti-fuse. Since the electric field in a dielectric layer is inversely proportional to its thickness, a thin insulation layer 34 is more likely to be broken down, and the write voltage can be lowered. In the preferred embodiment, insulation layer 34 has a thickness of less than about 1000 Å, and more preferably between about 50 Å and about 200 Å.

Insulation layer 34 is preferably formed conformally on sidewalls of trench opening 130 and via opening 128. Preferably, the thickness of the insulation layer 34 on the sidewalls of trench opening 130 and via opening 128 should not cause the breakdown of the insulation layer 34 when applied with a read voltage, for example, 1.2V. To make OTP anti-fuses fully compatible with CMOS circuits, the optimum thickness and material of the thin insulation layer 34 is preferably determined by the voltages that can be supplied by CMOS circuits. In the preferred embodiment, a write voltage of 5 volts or lower is preferred.

Figure 6:
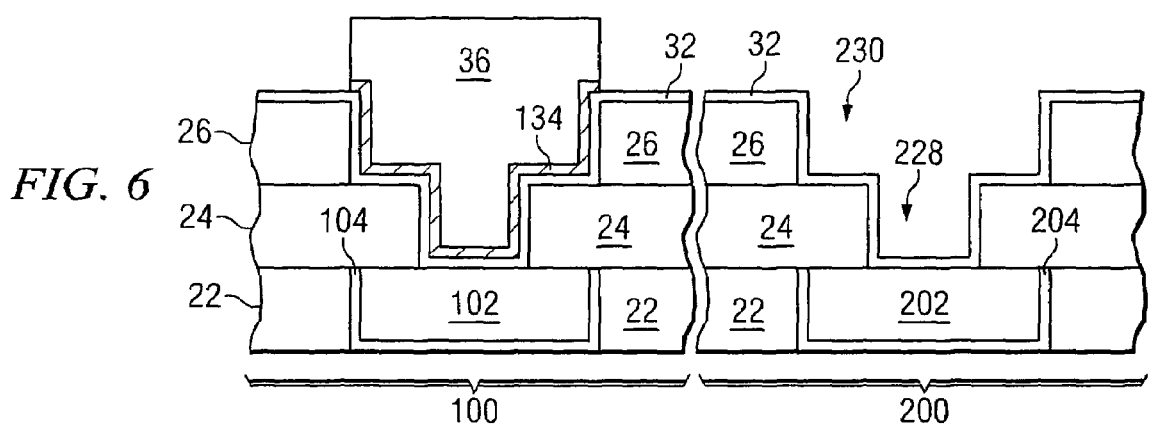

In FIG. 6, a photo resist 36 is formed and patterned. In the preferred embodiment, only the region over trench opening 130 is masked by photo resist 36. The remaining portions of photo resist 36 are removed. Alternatively, the entire region 100 is masked, and region 200 is exposed. The exposed portions of insulation layer 34 are then removed, preferably by etching, and the remaining portion of the insulation layer 34 is denoted as dielectric layer 134. Next, photo resist 36 is removed.

In alternative embodiments, the formation of insulation layer 134 includes forming a photo resist (not shown) covering region 200 while leaving region 100 exposed, and blanket forming the dielectric layer 134. When the photo resist is removed, the portion of insulation layer 34 on the photo resist is also removed.

Figure 7:
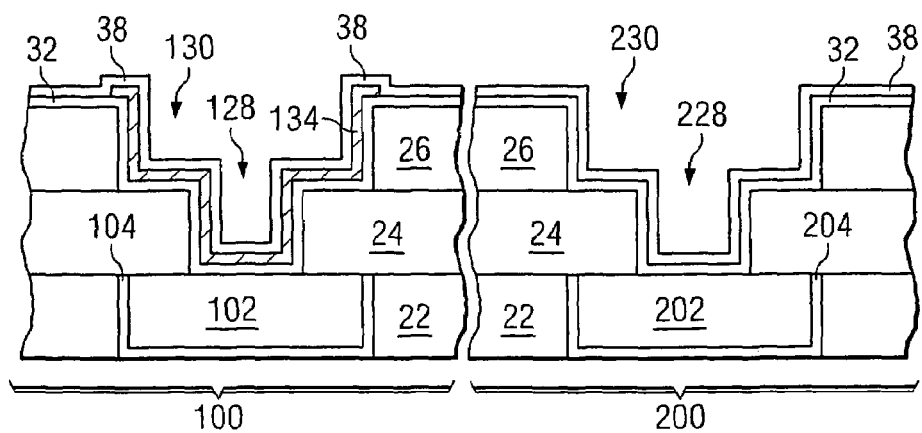

Referring to FIG. 7, a second diffusion barrier layer 38 is formed. The materials and formation methods are similar to those of first barrier layer 32, thus are not repeated herein.

Figure 8:
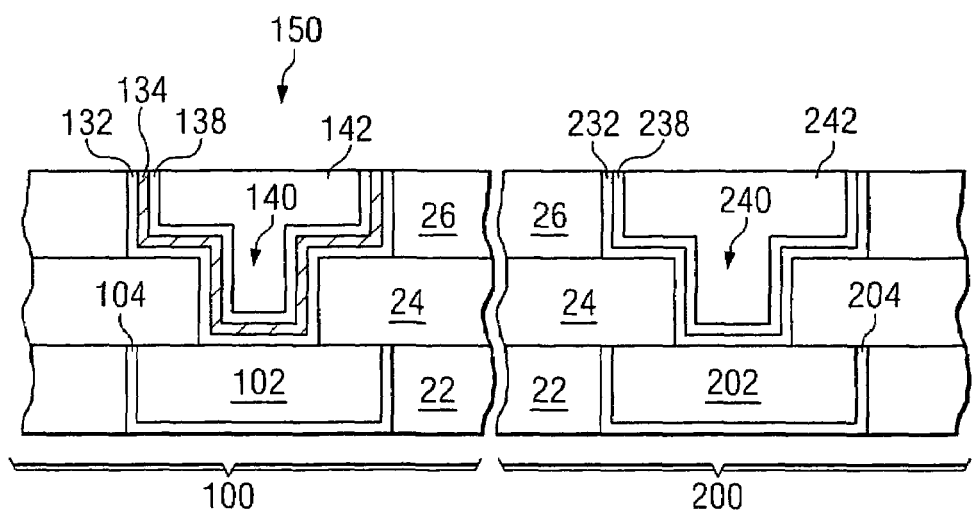

FIG. 8 illustrates the formation of upper-level metal lines 142 and 242 connecting to vias 140 and 240 in regions 100 and 200, respectively. As is known in the art, metal lines 142 and 242 may be formed by filling trench openings 130 and 230 and via openings 128 and 228 with a metallic material, preferably copper or copper alloys. A CMP is then performed to remove excess material. First diffusion barrier layer 32, insulation layer 134, and second diffusion barrier layer 38 may have portions over the top surface of trench IMD layer 26. Preferably, these portions are also removed by CMP. The remaining portions of first diffusion barrier layer 32 and second diffusion barrier layer 38 form diffusion layers 132 and 138 in region 100 and diffusion layers 232 and 238 in region 200.

In the previously-discussed embodiment, dual damascene processes are performed to form vias 140 and 240 and upper-level metal lines 142 and 242. In alternative embodiments, vias 140 and 240 and upper level metal lines 142 and 242 may be formed separately by using single damascene processes. In addition, although vias and upper-level metal lines are illustrated as formed in two dielectric layers, one skilled in the art will realize that they can be formed in a single dielectric layer.

Figure 9:
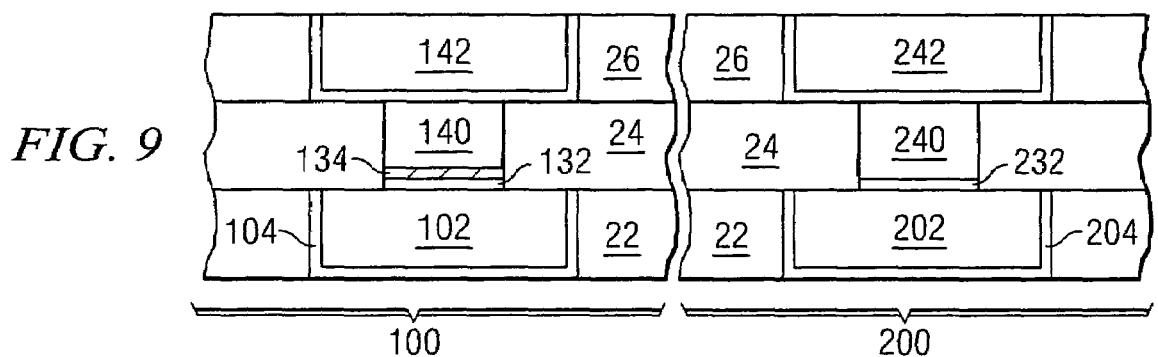
FIG. 9 illustrates a one-time-programmable anti-fuse formed with a contact over an insulation layer.

In alternative embodiments, metal lines 142 and 242 and connecting vias 140 and 240 shown in FIG. 8 can be formed in the form of contacts, and the corresponding structure is shown in FIG. 9. A preferred formation process is briefly described as follows. After the formation of lower-level metal lines 102 and 202 in dielectric layer 22, a diffusion barrier layer and a thin insulation layer are formed and patterned, leaving a diffusion barrier layer 132 and a thin dielectric layer 134 in region 100 and a diffusion barrier layer 232 in region 200. A metal layer, which preferably comprises tungsten, aluminum, silver, gold, metal alloy, metal nitride, and combinations thereof, is then formed. By patterning the metal layer, contacts 140 and 240 are formed in regions 100 and 200, respectively. Dielectric layer 24 is then formed.

In the embodiments shown in FIG. 9, upper-level metal lines 142 and 242 and lower-level metal lines 102 and 202 may also be formed using the same methods as used for forming contacts 140 and 240, although damascene processes are preferably used. Alternatively, the anti-fuse cell in region 100 may be formed using methods for forming contacts, while the via structure in region 200 is formed using damascene processes. However, the embodiment shown in FIG. 9 requires additional process steps.

Referring back to FIG. 8, metal line 142, via 140 and diffusion barrier layer 138 form one electrode of an OTP anti-fuse cell 150, and metal line 102 and diffusion barrier layer 132 form the other electrode. Insulation layer 134 electrically insulates the two electrodes, forming the anti-fuse cell 150. The anti-fuse cell 150 can be used as an OTP memory cell, which has a high-resistance state and a low-resistance state. To program the OTP anti-fuse cell 150, a voltage may be applied between the two electrodes, causing a breakdown in insulation layer 134. The resulting OTP anti-fuse cell 150 will be in a low-resistance state.

Figure 10:
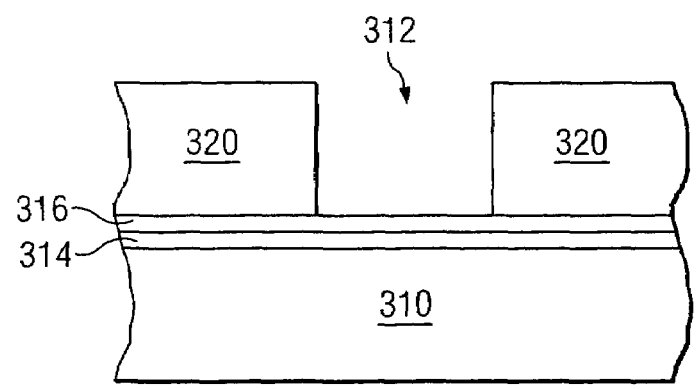
FIGS. 10 through 12 illustrate the formation of a second embodiment of the present invention, wherein a crown-type anti-fuse is formed.

In a second embodiment, an OTP anti-fuse having a crown-type MIM capacitor structure is formed. Referring to FIG. 10, a semiconductor substrate 310 is provided with an insulation layer 314 formed thereon. A metal line 316, for example, a copper line 316, is formed over insulation layer 314, followed by the deposition of an inter-metal dielectric (IMD) layer 320 over metal line 316. A damascene opening 312 is etched through IMD layer 320, exposing metal line 316.

Figure 11:
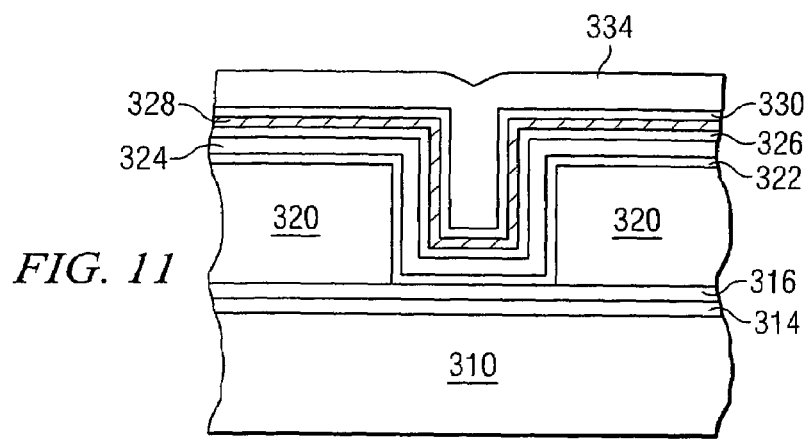

Referring to FIG. 11, a first diffusion barrier layer 322 is deposited conformally within the damascene opening 312 and on IMD layer 320. First diffusion barrier layer 322 may comprise titanium nitride, tantalum nitride, titanium silicon nitride, and/or tantalum silicon nitride. A first copper layer 324 is formed over first diffusion barrier layer 322, for example, by electroplating or electroless plating. The copper is formed on the bottom and sidewalls of the damascene opening. First copper layer 324 will form a portion of the bottom plate of the crown-type anti-fuse. A second diffusion barrier layer 326 is conformally deposited over copper layer 324. Second diffusion barrier layer 326 preferably comprises materials similar to those of first diffusion barrier layer 322.

An insulation layer 328 is conformally deposited over second barrier layer 326. Insulation layer 328 preferably comprises materials similar to those described for insulation layer 34 (refer to FIG. 5).

Next, a third diffusion barrier layer 330, which is similar to first and second diffusion barrier layers 322 and 326, is formed. A second copper layer 334 is then deposited to fill the damascene opening.

Figure 12:
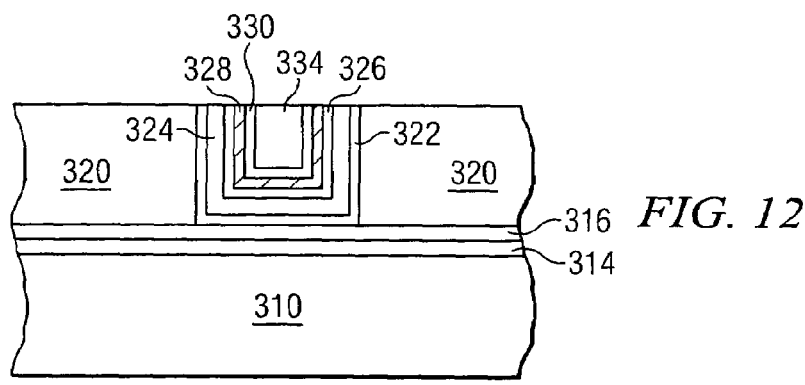

Referring now to FIG. 12, the previously formed layers are polished down until the layers remain only within the damascene opening 312. The second copper layer 334 forms the top electrode of the capacitor. An OTP anti-fuse, which has dielectric layer 328 as the insulation layer, and metal lines 316 and 334 as portions of a bottom electrode and a top electrode, respectively, is thus formed.

Figure 13:
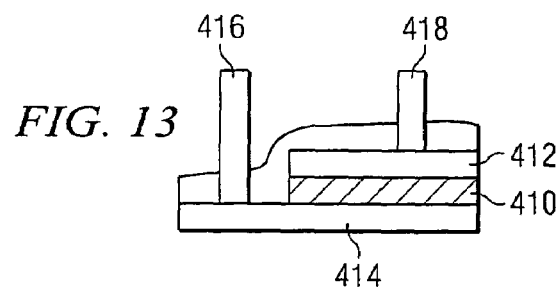
FIG. 13 illustrates the formation of a third embodiment of the present invention, wherein a planar anti-fuse is formed.

In a third embodiment of the present invention, an OTP anti-fuse having a planar MIM structure, as is shown in FIG. 13, is formed. The planar anti-fuse includes a top plate 412, a bottom plate 414 and an insulation layer 410 therebetween. Bottom plate 414 is preferably bigger than top plate 412. Contact plugs 416 and 418 connect to the bottom plate 414 and top plate 412, respectively. Each of the top and bottom plates 412 and 414 may further include diffusion barrier layers. One skilled in the art will realize the respective formation steps.

Figure 14:
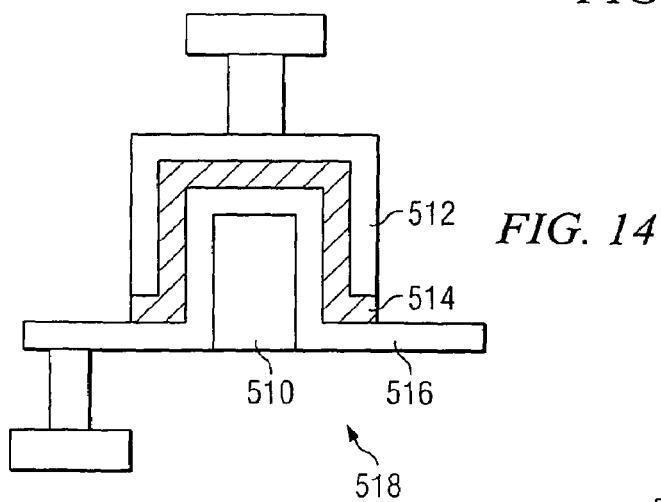
FIG. 14 illustrates a fourth embodiment with a convex stack.

In a fourth embodiment of the present invention, an OTP anti-fuse having a convex stack, as is shown in FIG. 14, is formed. The OTP anti-fuse includes a dielectric structure 510 over a dielectric layer 518. If viewed from the top, dielectric structure 510 preferably has the shape of a rectangle, and more preferably a square. The length and width of dielectric structure 510 are preferably similar to the dimensions of opening 128 shown in FIG. 5. A bottom plate 516 is formed on dielectric structure 510, followed by the formation of an insulation layer 514 and a top plate 512. Bottom plate 516, insulation layer 514 and top plate 512 preferably extend on sidewalls of dielectric structure 510. Again, each of the top and bottom plates 512 and 516 may further include diffusion barrier layers. One skilled in the art will realize the respective formation steps.

In the formation of integrated circuits, due to the size limit, it is hard to form a capacitor with a big capacitance, thus a capacitor typically requires a great area to increase the capacitance. An anti-fuse, however, does not have such a requirement, and thus its dimensions (length and width) may be small. In the preferred embodiment, the dimensions of the insulation layer are less than about 110 percent of the minimum dimension allowed by the forming technology (or design rules). More preferably, the dimensions of the insulation layer are as small as the minimum dimension allowed by the forming technology. For example, in 65 nm technology, the diameter and thickness of the insulation layer are about 100 nm and about 10 nm, respectively. The anti-fuses are preferably formed simultaneously with the formation of capacitors having similar structures in order to save cost. Preferably, the via-like, crown-type and planar anti-fuses are formed in metallization layers, and more preferably use damascene processes, so that their formation is compatible with the existing interconnect structure formation processes.

The previously discussed anti-fuse will be operated under two voltages: a relatively low voltage for read operations and a relatively high voltage for write operations. The anti-fuses are configured (formed) such that the write voltage is high enough to cause the breakdown of the insulation layer, while the read voltage is not high enough to cause the breakdown. The material and the thickness of the insulation layer will be determined accordingly.

Figure 16:
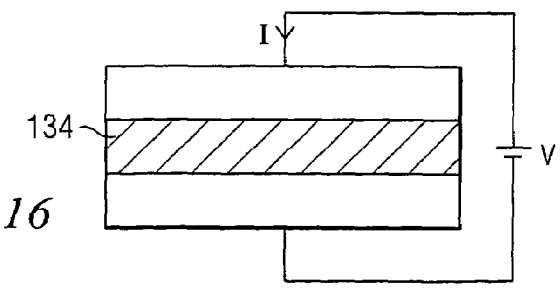
FIG. 16 illustrates an exemplary setting for a simple form of write and read operations of the preferred embodiments.
Figure 15:
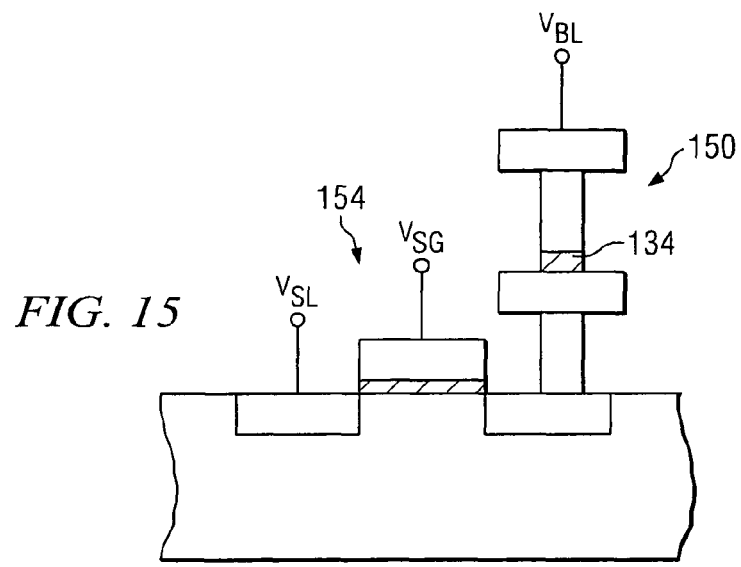
FIG. 15 illustrates an exemplary setting for write and read operations of the preferred embodiments, wherein a MOS device is used for controlling the write and read currents.
Figure 17:
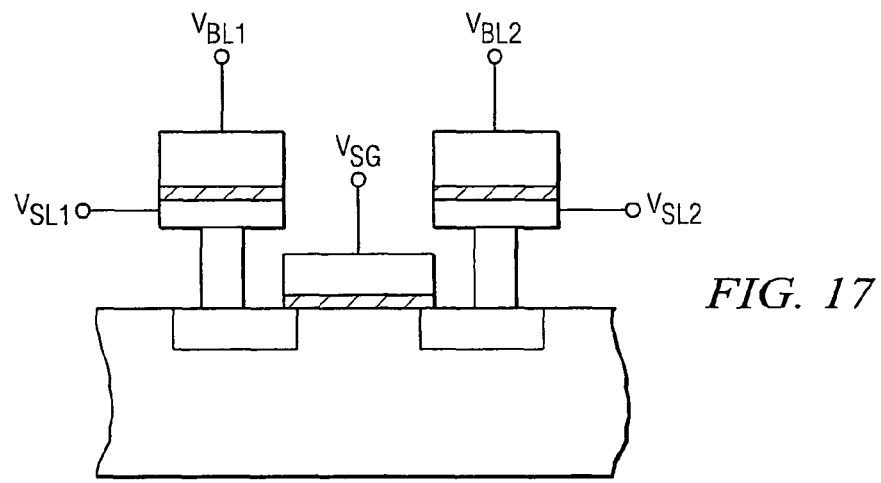
FIG. 17 illustrates a mirror structure for connecting two anti-fuse cells.

Exemplary connections of the anti-fuse cells are illustrated in FIGS. 15 through 17. FIG. 15 illustrates a preferred connection for an anti-fuse cell. The schematically illustrated OTP anti-fuse cell 150 is coupled in series to a low-voltage node having a source-line voltage $V_{SL}$ at one end and a bitline having a voltage $V_{BL}$ at the other end. In an exemplary embodiment, a transistor 154 is connected so that the selection of the anti-fuse cell 150 is controlled by a selection gate having a voltage $V_{SG}$. $V_{SL}$ is preferably 0V. When a voltage $V_{SG}$ greater than the threshold voltage of the transistor 154 is applied, the OTP anti-fuse cell 150 is selected. If a high-resistance state is to be written, the bitline $V_{BL}$ voltage is 0V. Since voltage applied on OTP anti-fuse cell 150 is 0V, OTP anti-fuse cell 150 remains intact with a high resistance. Conversely, if a low resistance state is to be written, $V_{BL}$ is applied with a high voltage, such as 5V. Insulation layer 134 is non-conductive, thus the entire voltage ($V_{BL}$–$V_{SL}$) is applied on the insulation layer 134, resulting in breakdown. The two electrodes of the OTP anti-fuse cell 150 are thus electrically connected, and the OTP anti-fuse cell 150 is in a low-resistance state. One skilled in the art will realize that the high-resistance state or low-resistance state can be denoted as either state "0" or "1", depending on the design preference.

In a read operation, a voltage is applied to the selection gate to turn on the transistor 154. A low voltage $V_{BL}$ greater than 0V but lower than the breakdown voltage of the OTP anti-fuse cell 150, such as 1.2V, is applied to the bitline. $V_{SL}$ is preferably 0V. If the OTP anti-fuse cell 150 is in a high-resistance state, a low current $I_{BL}$ is detected. Conversely, if the OTP anti-fuse cell 150 is in a low-resistance state, a high current $I_{BL}$ is detected. The current $I_{BL}$ is thus used to determine the state of the OTP anti-fuse cell 150.

FIG. 16 illustrates a simpler form for connecting anti-fuse cells. A voltage V, which may be either the write voltage or the read voltage, is applied between the two plates of the anti-fuse. When a write voltage is applied, insulation layer 134 breaks down, and the two plates are electrically connected. When a read voltage is applied, the magnitude of the current I is used to determine the state of the anti-fuse.

FIG. 17 illustrates two mirror bits controlled by a MOS device. The read and write operations of the anti-fuse on the left is controlled by $V_{BL1}$ and $V_{SL2}$, while the read and write operations of the anti-fuse on the right is controlled by $V_{BL2}$ and $V_{SL1}$. Both bits are controlled by a gate voltage $V_{SG}$.

Figure 18:
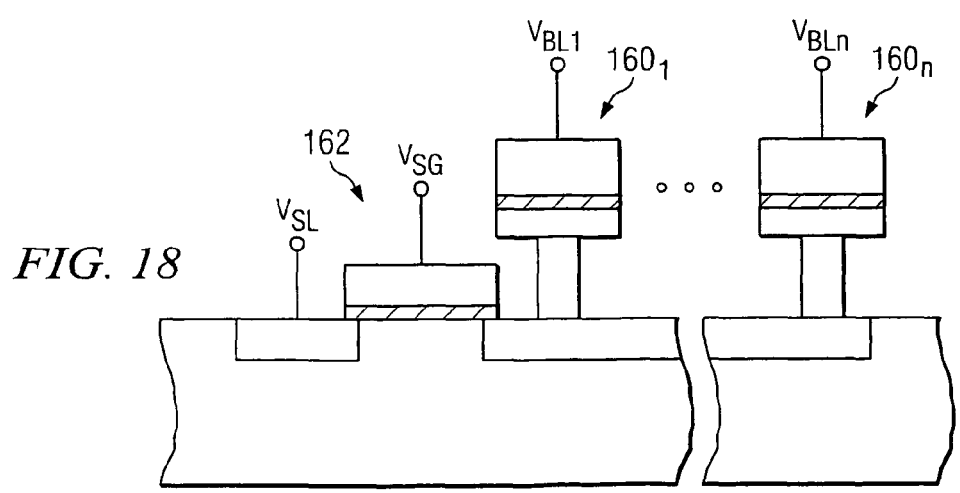
FIG. 18 illustrates a plurality of anti-fuse cells connected in parallel.

FIG. 18 illustrates a series of parallel anti-fuses $160_1$ through $160_n$, which are connected to a drain region of a common MOS device 162. Using this connection, the n anti-fuses are all controlled by MOS device 162. The read and write operations of each bit are controlled by voltages $V_{SL}$, $V_{SG}$ and the respective bitline voltages $V_{BL1}$ through $V_{BLn}$.

The anti-fuse cells of the present invention can be used in various applications. A common use is for replacing malfunctioning circuits, such as memory cells. By breaking down the insulation layer and causing the anti-fuse to be conductive, a redundant memory cell connected to the OTP anti-fuse cell will replace a malfunctioning memory cell. Anti-fuses can also be used to represent a chip identification number, which is preferably defined by breaking down a series of OTP anti-fuse cells while leaving the rest intact. Use of the present invention also includes selecting circuit functions by enabling/disabling certain circuits and adjusting resistances for analog or digital circuit.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such applications, processes, machines, manufacture, compositions of matter, means, methods, or steps.

What is claimed is:

1. A one-time-programmable (OTP) anti-fuse comprising:
a semiconductor substrate;
a first dielectric layer over the semiconductor substrate;
a lower-level metal line comprising copper in the first dielectric layer;
a via above the lower-level metal line, the via and the lower-level metal line defining an area of at least partial alignment;
an insulation layer between the lower-level metal line and the via and occupying the area of at least partial alignment, wherein the insulation layer is substantially limited to a region directly underlying a bottom of the via; and
an upper-level metal line comprising copper in a second dielectric layer, the second dielectric layer having a low dielectric constant, wherein the upper-level metal line is on and electrically coupled to the via.

2. The OTP anti-fuse of claim 1 further comprising a power source coupled to the OTP anti-fuse, wherein the insulation layer has a breakdown voltage lower than a pre-determined write voltage provided by the power source and higher than a pre-determined read voltage provided by the power source.

3. The OTP anti-fuse of claim 1, wherein the insulation layer has a breakdown field lower than a breakdown field of $SiO_2$.

4. The OTP anti-fuse of claim 1 further comprising a first diffusion barrier layer between the insulation layer and the lower-level metal line, and a second diffusion barrier layer between the insulation layer and the via.

5. The OTP anti-fuse of claim 1, wherein the via comprises a material selected from the group consisting essentially of copper and tungsten.

6. The OTP anti-fuse of claim 1, wherein the lower-level metal line is electrically insulated from the via and the upper-level metal line by the insulation layer.

7. The OTP anti-fuse of claim 1, wherein the insulation layer is electrically broken down, and wherein the lower-level metal line is electrically coupled to the via and the upper-level metal line through the insulation layer.

* * * * *